(12) United States Patent
Wang et al.

(10) Patent No.: US 8,117,039 B2
(45) Date of Patent: Feb. 14, 2012

(54) MULTI-STAGING RECURSIVE AUDIO FRAME-BASED RESAMPLING AND TIME MAPPING

(75) Inventors: Zhicheng Lancelot Wang, Los Altos, CA (US); Jianguang Jiang, Pleasanton, CA (US)

(73) Assignee: Ericsson Television, Inc., Duluth, GA (US)

( * ) Notice: Subject to any disclaimer, the term of this patent is extended or adjusted under 35 U.S.C. 154(b) by 635 days.

(21) Appl. No.: 12/334,779

(22) Filed: Dec. 15, 2008

(65) Prior Publication Data

US 2010/0153122 A1    Jun. 17, 2010

(51) Int. Cl.
*G10L 19/00* (2006.01)

(52) U.S. Cl. ........................................ 704/501

(58) Field of Classification Search .................. 704/501; 341/123; 708/313
See application file for complete search history.

(56) References Cited

U.S. PATENT DOCUMENTS

| | | | | |
|---|---|---|---|---|
| 5,856,796 | A * | 1/1999 | Akune et al. ................. | 341/61 |
| 6,061,315 | A * | 5/2000 | Inagawa et al. ............. | 369/47.28 |
| 6,487,573 | B1 | 11/2002 | Jiang et al. | |
| 6,987,821 | B1 * | 1/2006 | Li ................................ | 375/345 |
| 7,590,531 | B2 * | 9/2009 | Khalil et al. .................. | 704/228 |
| 7,831,434 | B2 * | 11/2010 | Mehrotra et al. ............. | 704/500 |
| 7,833,824 | B2 * | 11/2010 | Lee ............................... | 438/95 |

FOREIGN PATENT DOCUMENTS

EP    1 076 415 A1    2/2001

OTHER PUBLICATIONS

Mottaghi-Kashtiban et al., Optimum Structures for Sample Rate Conversion from CD to DAT and DAT to CD Using Multistage Interpolation and Decimation, Aug. 1, 2006, pp. 633-637, Section II, IEEE International Symposium on Signal Processing and Information Technology.
Murthy et al., Minimizing Memory Requirements for Chain-Structured Synchronous Dataflow Programs, Apr. 19, 1994, pp. II/453-II/456, Section 5, IEEE, Proceedings of the International Conference on Acoustics, Speech, and Signal Processing (ICASSP).
Charles Meyer, Digital Audio Synchronization in a Mixed-Media Plant, Journal, Jan. 1, 1993, pp. 132-135, vol. 102, No. 2, SMPTE Journal, SMPTE Inc. Scarsdale, N.Y.
International Search Report for PCT/US2009/065093 dated Mar. 1, 2010.
Mohammed Rehman, Multi-Rate Processing and Sample Rate Conversion: A Tutorial, Retrieved on Nov. 21, 2008 from Internet site http://www.commsdesign.com/article/printableArticle.jhtml?articleID=16504259, pp. 1-7, CommsDesign.
Wikipedia, Sample Rate Conversion, Retrieved on Nov. 21, 2008 from Internet Site http://en.wikipedia.org/wiki/Sample_rate_conversion, pp. 1-5, Wikipedia.

* cited by examiner

*Primary Examiner* — Michael N Opsasnick

(57) ABSTRACT

A multi-stage recursive sample rate converter ("SRC") typically embodied as digital signal processor provides for an efficient structure for converting digital audio samples at one frequency, such as 48 kHz, to another frequency, such as 44.1 kHz. A parameter codebook comprising memory stores parameters used at a plurality of stages by the SRC. For each stage, a controller coordinates the SRC to use the appropriate set of parameters from the codebook, process an input audio sample stream, and store the intermediate results in a buffer. The controller then causes the intermediate results to be processed again as input to the SRC in a subsequent stage of processing using a different set of parameters. The process is repeated until all stages are completed, and the final results are the output digital audio data stream at the desired sampling rate.

19 Claims, 6 Drawing Sheets

MULTI-STAGING RECURSIVE AUDIO FRAME-BASED RESAMPLING AND TIME MAPPING

FIELD OF INVENTION

Figure 1:
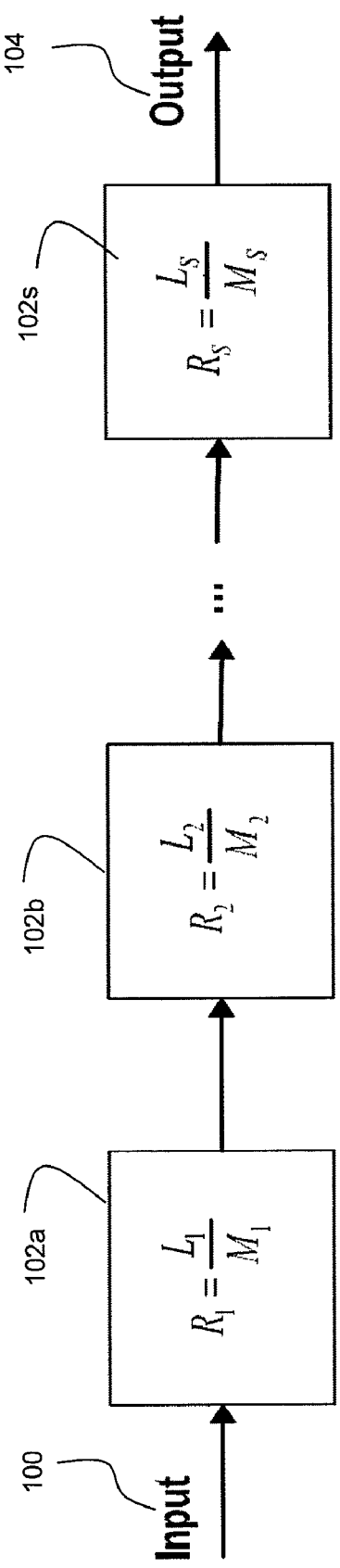

This disclosure generally pertains to a digital signal processing by providing a universal multi-staging and recursive audio frame-based resampling and time mapping implementation scheme, which can be used for audio sample rate conversions in multimedia applications.

BACKGROUND OF THE INVENTION

In digital signal processing, sampling/frame rate conversion has various applications. In the multimedia compression, transformation, networking and display markets, it is often the case that an audio sample at one rate needs to be converted into a second, or target rate that is different. For example, professional audio equipment may utilize a higher audio processing rate than consumer electronics, which operate at a lower processing or sampling rate. To save storage, processing and transmission bandwidth resources, the rate conversion is usually a "downward" conversion. Specifically, the encoding rate is reduced. There are some transcoding processes or synchronization re-alignments in audio and video applications (both storage and transmission) that require resampling and time-mapping processing.

Due to the discrete mode of the human vision model, humans can tolerate some image dropping or insertion during a video sequence to a significant extent. However, the human ear can detect even small audio data distortions or losses, and these can rapidly become annoying to the listener. Thus, merely dropping bits from the sample is not desirable to effect the conversion.

In general, the frame/sample rate conversion and related time stamp conversion designs are application specific and have variations in terms of quality, complexity, feature, resource usage and other attributes.

The polyphase filter with a finite impulse response ("FIR") structure is a very popular and effective approach for the sampling/frame rate conversion tasks. However, a polyphase FIR filter's implementation can become difficult, cumbersome or unfeasible on some platforms, in terms of efficiency, precision, robustness, and resource usage, when the sampling rate conversion becomes complex and interpolation and decimation factors are high.

Some resampling applications demand a wide range of flexibility and must adapt to the real-time resampling variation or even unknown resampling ratio. Therefore, there is a need for a flexible architecture to perform sampling/frame rate conversions for audio applications in a lower cost, and more effective manner.

BRIEF DESCRIPTION OF THE SEVERAL VIEWS OF THE DRAWING(S)

Figure 2:
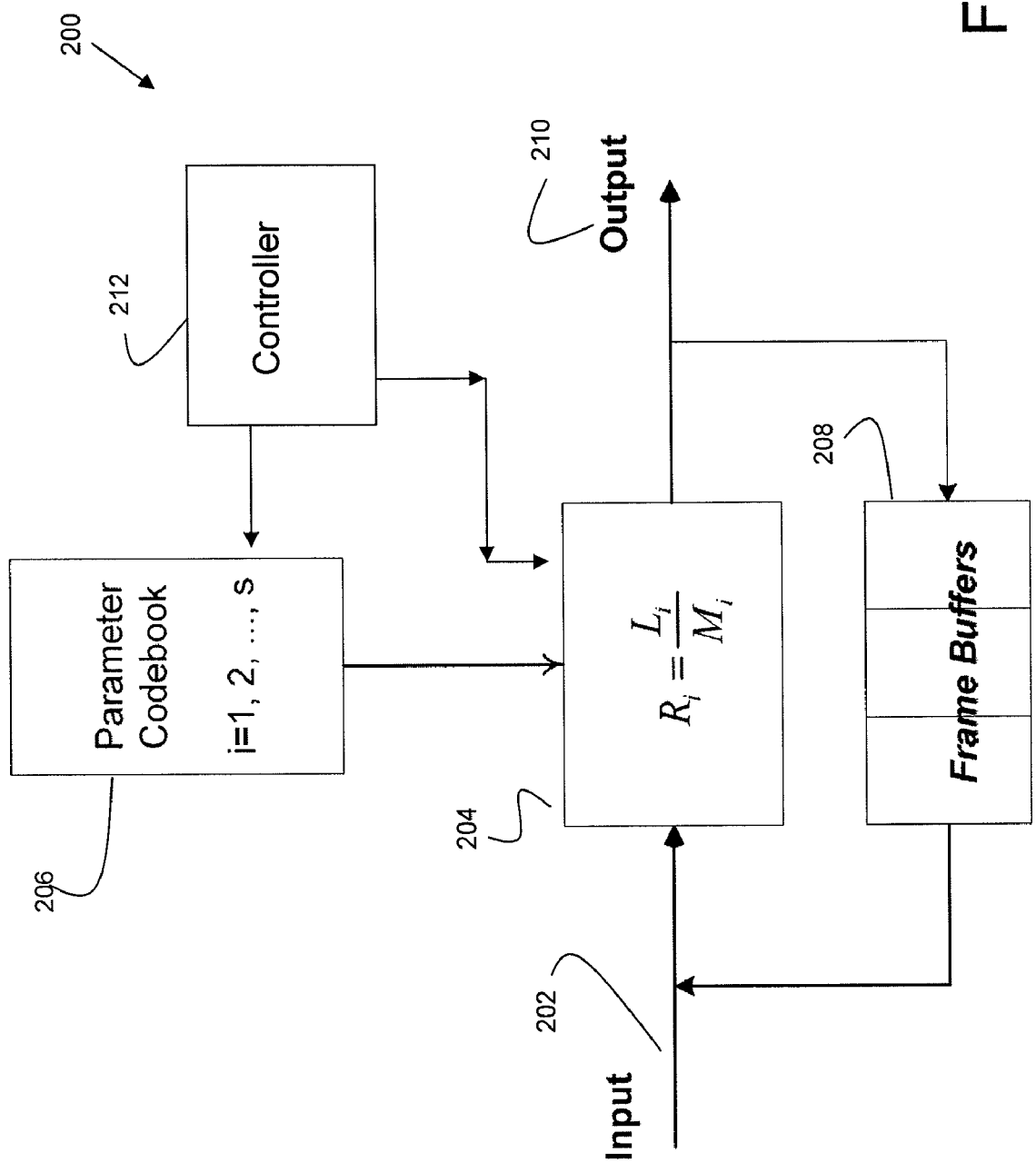
Figure 3:
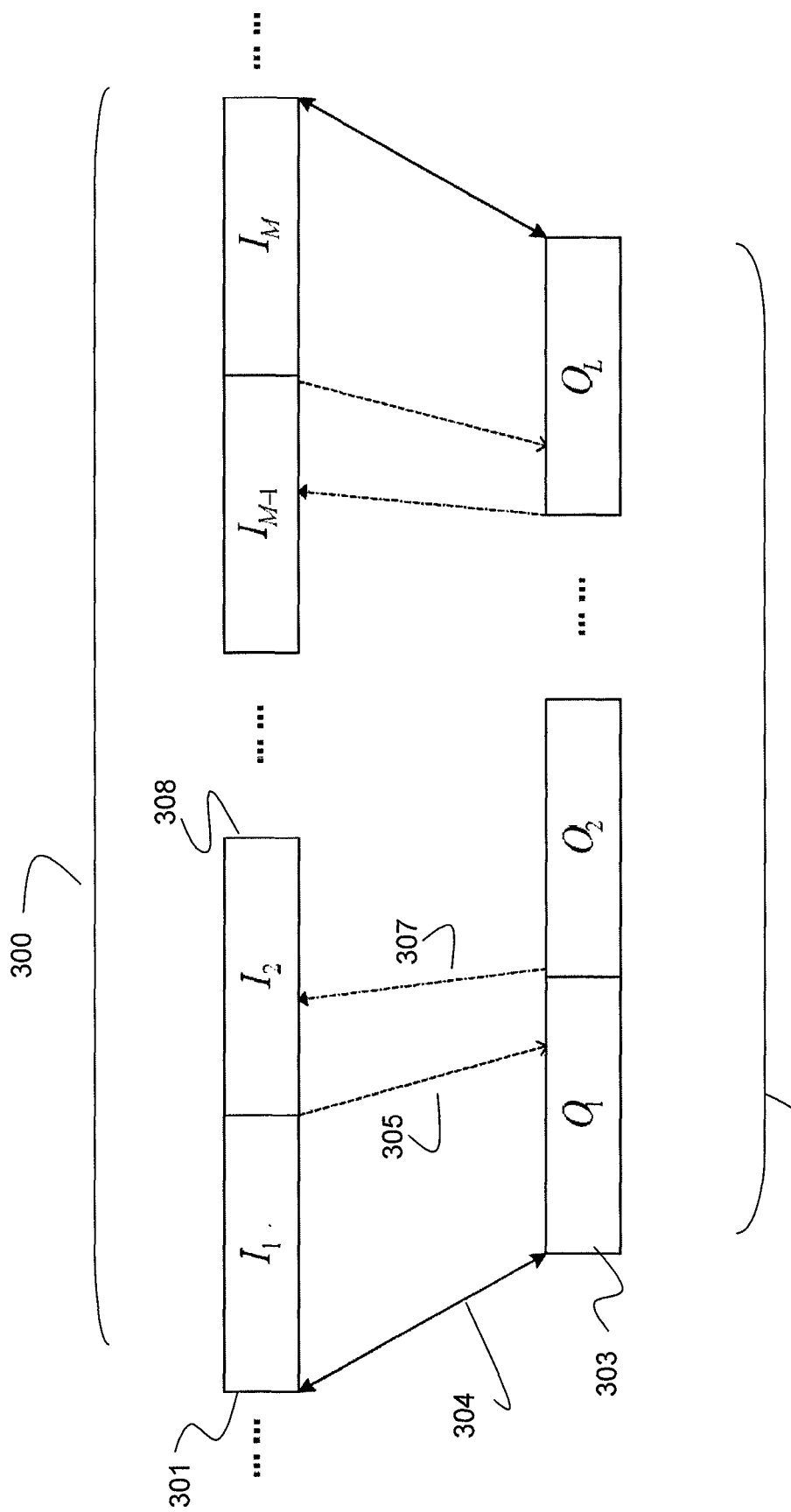
Figure 4:
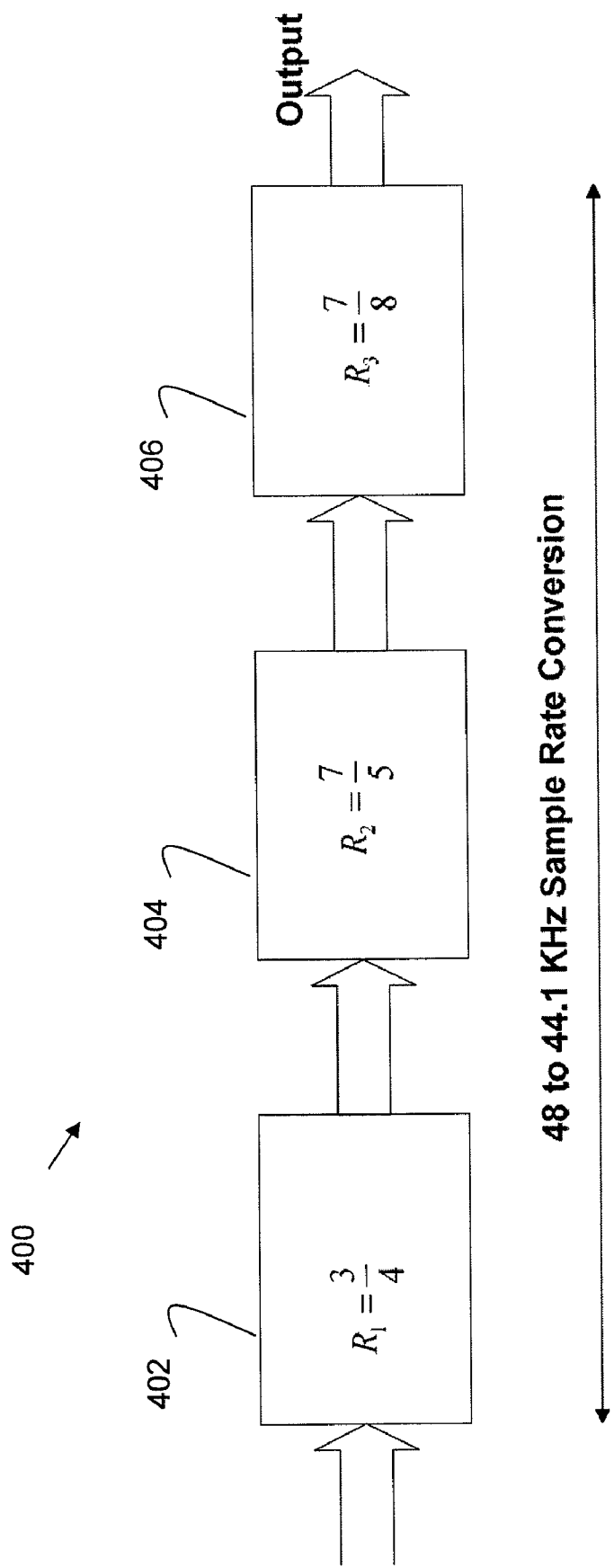
Figure 5:
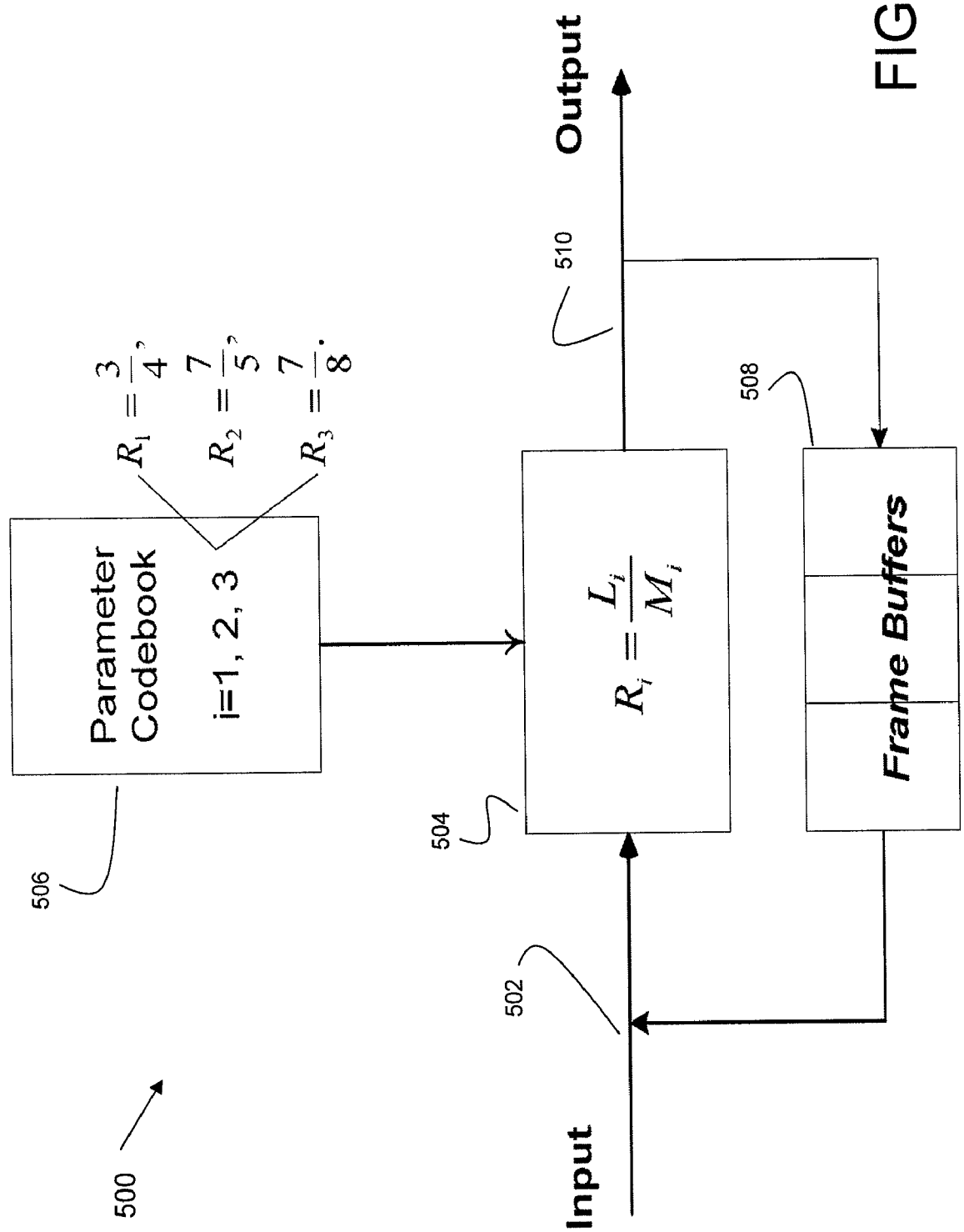
Figure 6:
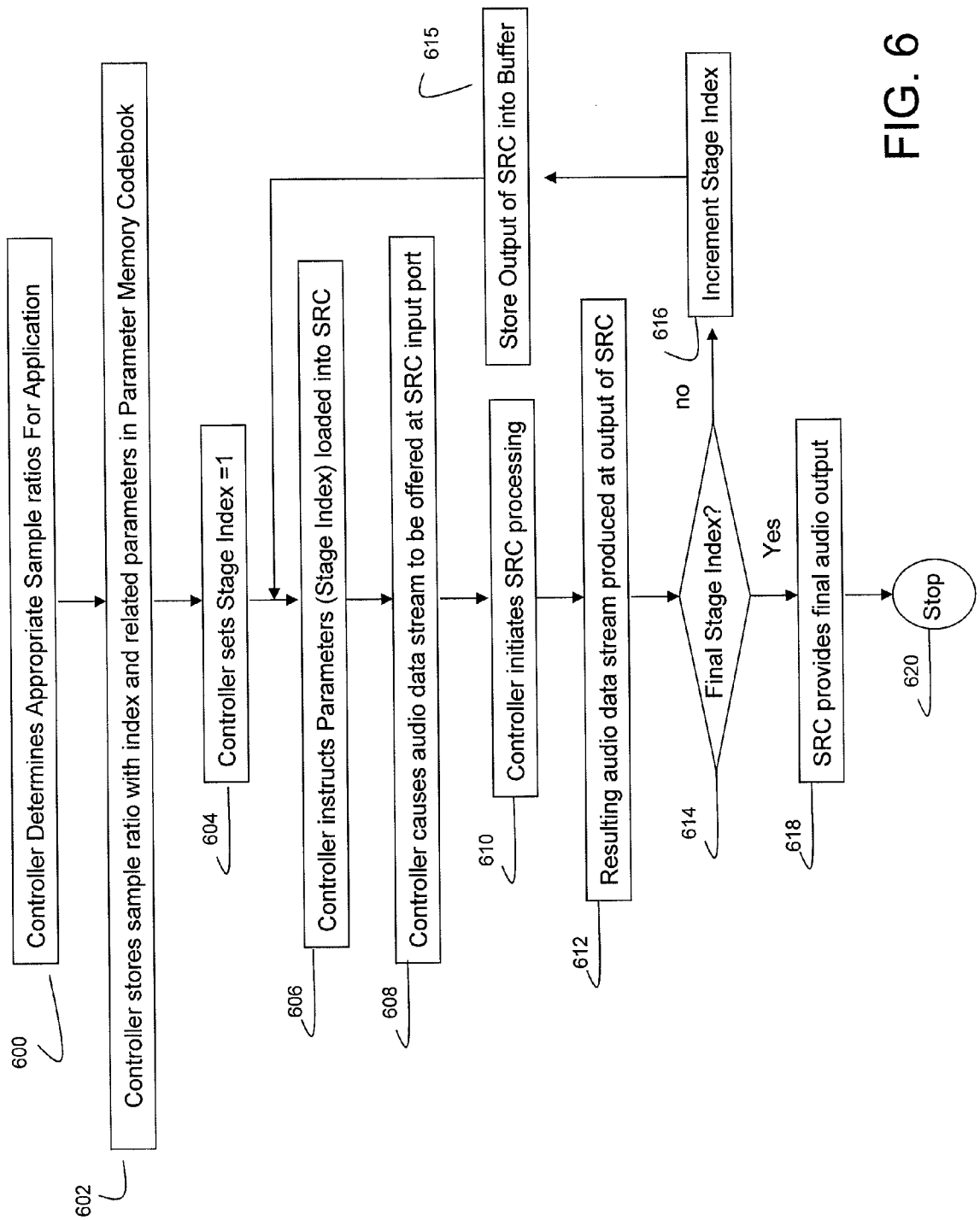

Having thus described the invention in general terms, reference will now be made to the accompanying drawings, which are not necessarily drawn to scale, and wherein:

FIG. 1 discloses a prior art process of multi-stage filtering.
FIG. 2 discloses one embodiment of the architectural implementation of the present invention.
FIG. 3 discloses one embodiment of a resampling application for multimedia applications.
FIG. 4 discloses one embodiment of multiple stage processing for an application of sample rate conversion of the present invention.
FIG. 5 discloses one embodiment of the architectural implementation of the present invention for sample rate conversion.
FIG. 6 discloses one embodiment of the process flow of the present invention.

DETAILED DESCRIPTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The resampling and time mapping scheme herein is for sampling/frame rate conversion, which can be used for adjusting for time drifting prevention, and audio-video synchronization. It is mainly targeted for audio data applications, particularly in multi-media applications. The scheme has the features of easy implementation, uniform, efficiency, robustness, flexibility, adaptation and resource saving.

The benefits of the proposed scheme are as follows:
 the methodological process and implementation of the scheme can be utilized for resampling and time mapping with universality;
 makes complicated resampling filter easy to design and implement;
 efficiently uses resources and buffers small amounts of data;
 short processing time delays;
 allows for no time stamp rounding and error accumulation and propagation; and
 maintains the exact original audio and video synchronization without drifting, e.g., re-synchronizes the audio and video in case of audio or video time clock drifting.

It is well known that a practical application of sampling rate conversion is in the field of professional digital audio. Common applications include converting one audio sampling rate to another. The present inventions allows for not only efficient and effective rate audio sampling rate conversion, but also of audio/video timing and synchronization adjustment and modification.

The present invention for sampling rate conversion and time mapping preferably uses polyphase filters as the basic resampling system form of decimation and interpolation. Assume that R is the resampling ratio, equation 1 indicates:

$$R = L/M \quad \text{Equation (1)}$$

where L is the symbol for interpolation factor and M for decimation factor. When L and M are low in value, the resampling system implementation with a polyphase filter is potentially straight forward and its performance can obtain high quality results using a fair amount of resources.

When values of interpolation and decimation factors are greater than a single digit (e.g., greater than 10), the direct design and implementation of the polyphase filter and resampling system becomes undesirable with respect to system size, inefficiency, accuracy, resource, quality, delay and other adverse impacts. For instance, the requirements of a narrow lowpass cut off frequency of FIR filter and steep frequency transition band would result in a large number of delay taps, poor stop band attenuation, high computational complexity, long delay, high resource requirements, and high quantization and rounding noise.

In some extreme cases of large interpolation and decimation factor values, the requirements of filter designs, such as delay tap numbers and parameter precision, are so high that the designed filter implementations are difficult, if not impossible, on a given hardware platform.

To address these issues, a multi-staging resampling process is used to tackle those problems mentioned above. Multistaging of resampling processing is formulated and depicted in the following equation:

$$R = \frac{L}{M} = \frac{L_1}{M_1} * \frac{L_2}{M_2} * \ldots * \frac{L_s}{M_s} = \prod_{i=1}^{s} \frac{L_i}{M_i} = \prod_{i=1}^{s} R_i \qquad (2)$$

This is depicted in FIG. 1 as a series of stages 102*a-s* which receives an input signal 100, and generates the output 104. This multi-staging approach is known in the prior art, and offers various benefits known to those skilled in the art.

There are some restrictions in the multi-staging process: (1) the Nyquist criteria must be preserved at each resampling stage, except for applications that allow a reduction in the original fidelity; and (2) the original interpolation or decimation factors cannot be prime numbers. However, it is usually the case that the prime numbers are low values, which do not need to have multi-staging or they can be approximated with non-prime numbers having a close resampling rate sufficiently approximate for most applications. Such an approach increases the resource requirements for processing an audio stream. Obviously, with an increase of discrete stages there is an increase of resources required.

One aspect of the present invention is to reuse the filter resource to perform the multiple stages by defining a recursive implementation of the multi-staging resampling system. A recursive architecture can reduce filtering delay, pipeline resampling stages, parallelize the computation on a parallel computing engine like DSP VLIW platforms, and reduce memory requirement further.

As shown in FIG. 2, a universal resampling filter system 200 includes four major parts. A first part involves a maximum capacity resampling filter 204 with $R_u=L_u/M_u$, where $L_u$ is maximum value of the multi-stage interpolation factors and $M_u$, is the maximum value of the multi-state decimation factors as a maximum filter container. This may be embodied using any variety of digital signal processors or their equivalent. The filter 204 has an input 202 for receiving data, such as the audio samples to be processed, and an output 210, which can be in on embodiment, the audio samples at a lower rate.

Next, a parameter codebook 206 stores the filter parameters, memory size and data addresses required for each resampling stage. The whole resampling system delay is $M_u$ samples.

The parameter codebook stores a series of parameter sets that include resampling stage index, resampling ratio, decimation/interpolation factors, number of iterations/stages, phase value of polyphase filter, filter coefficients, selection score, and data memory. These parameters may be known and stored in the codebook before any processing of the data, or one of a plurality of sets of parameters may be selected, based on the particular application involved.

A third part involves a set of audio frame buffers 208 for input and output storage of each resampling stages and iterations. The frame buffer size is appropriate based on the application. The frame buffers may store the intermediate output of the filter, which is then feed back into the filter.

Finally, a controller 212 coordinates the operation of the system based on the programmed application. It indicates which stage is to be processed, and ensures that the appropriate parameter codebook values for that stage are being used. In certain embodiments, the controller may be also allocated frame buffers 208 as appropriate for the application.

The use of the components allows:
1. uniform and more efficient structure for implementations and applications because the same overall structure can be used for different applications and is flexible to accommodate various resampling stage number configurations and the parameter changes, enhancing the system applicability and usage,
2. quasi-adaptation to application,
3. more efficient use of resources, and
4. dynamic system updating and easy maintenance.

The functional relationship of these three components for a single stage 200 are shown in FIG. 2, wherein an input 202 is provided to the resampling filter 204, which receives various processing parameters from the codebook 206. The output of the resampling filter 204 is provided to a set of frame buffers 208, which is re-processed by the resampling filter 204. Finally, the output 210 of the resampling filter is provided. The values of the parameters may be determined by the controller, or defined as a set to be used for a particular application.

Typically, the resampling ratio is not always known in advance to the applications, or may even vary in different applications. Specific examples include using video frame synchronizers in order to provide synchronization of a video image with an external studio reference. Then, the relationship between video and audio sample will drift relative to one another and if left uncompensated will cause an audio/video synchronization error. In this case, the relative drift rate is not known in advance and, in fact, may vary over time. A universal recursive resample system using a pre-configured structure and resource can provide pre-defined resampling rate adaptation range at a granular level. The basic system structure and resources required do not need to vary much, while all the variations are controlled by the parameters stored in the parameter codebook.

An implementation of the virtual universal recursive filter can be varied with its implementation platforms such as parallel implementation on DSP Very Long Instruction Word ("VLIW") structure or time division implementation on a Field Programmable Gate Array ("FPGA") or an Application Specific Integrated Circuit ("ASIC") with a microcontroller.

There are trade offs between speed (time) and memory. In practice, the speed can be achieved by the recursive resampling implementation due to the parallel nature of a platform. The multi-staging and recursive resampling implementations can be used simultaneously according to the application requirements.

To maintain the audio system timing and synchronization, time stamps of the original data have to be mapped into the time stamps of resampled data. A time stamp is always associated with each audio frame. Due to the sampling rate change, there is no direct mapping between original frames and resampled frames of audio data. Although the time stamp of each resampled frame in a data stream can be calculated according to the output (new) sampling rate, it would cause system time drifting and de-synchronization because of rounding errors.

In order to maintain the proper timing and synchronization, a segmental time mapping scheme is used as depicted in FIG. 3. In a resampling system with factor R=L/M, choose M original data frames, shown as I (input) frames 300 as a mapping segment and map its beginning time stamp directly to the beginning of the corresponding resampled L-frame segment, shown as O (output) frames 302, which maintains the exact original timing in a segmental-wise fashion. A time stamp for each frame within the resampled segment can be calculated accordingly. In an implementation, it is not necessary to buffer all of the M original frames as input or the L resampled frames as output, other than the input and output frame counts beginning time stamp memory, and output frame index.

As shown in FIG. 3, the time of the first input frame of an input segment corresponds to the first output frame of the output segment, as denoted by arrow 304. As a result, the amount of audio information contained in the in first frame 301 is reduced to fill up a portion of the first output frame 303. In a corresponding manner, the first output frame 303 conveys information derived from more than just the first input frame 301 as shown by line 305. Rather it incorporates from $I_1$ 301 and $I_2$ 308, as shown by line 307.

This resampling and time mapping scheme also avoids the time mapping and calculation during the multi-staging and recursive processes and provides the freedom of allocating buffers as required in these processes.

This time mapping scheme can also be used to manipulate data frame timing to correct time drifting and de-synchronization by incorporating a resampling process, which will be discussed below. A simple resampling system can be done with one resampling stage filter: s=1.

In one embodiment, the invention can be used for converting an audio sample rate from 48 kHz to 44.1 kHz. If a direct design method is used for the 48 kHz to 44.1 kHz conversion typical nominal design requirements would include: a 70 dB attenuation stopband, a transition band that is less than one fourth of the passband (which is very loose requirement), and passband ripple is less than 5 percent. The design results in 5529 filter taps in total and a parameter coefficients' precision requirement of 51-bits. Further, this designed system is very vulnerable to platform noise and implementation value truncation. A design using a direct method is not very attractive for implementation and application.

Using the principles of the present invention, it is optimal and more efficient to use multi-staging and recursive resample processing to convert the sampling rate of 48 kHz used by professional audio equipments to the sampling rate of 44.1 kHz used by consumer audio equipments. The rate conversion (resampling) factor is factorized and cascaded as follows and in FIG. 4:

$$R = \frac{L}{M} = \frac{147}{160} = \frac{3}{4} * \frac{7}{5} * \frac{7}{8}$$

Other ratios could be used. For example, the M value of 160 can be factored as 10*8*2, which would provide for sample ratios of 3/10, 7/8, and 7/2 to be used. However, the previous values avoid used of double digits values (e.g., M=10). An FIR polyphase filter design and implementation can be controlled within 280 taps for each resampling stage according to the nominal filter design requirements such as ripple in passband, attenuation at stop band, and transition band slope.

The example multi-staging system 400 as shown in FIG. 4 has three stages, wherein stage 1 402 has 141 taps, stage 2 404 has 245 taps, and stage 3 406 has 280 taps. These total resampling stages, respectively, and has 666 taps in total of the whole resampling system. By implementing this in a recursive manner, a nine-fold memory savings is achieved which reduces computational complexity, in addition to providing better system robustness, shorter system time delay, quicker system time response and consistent better quality and performance. As an example, the whole implementation would take about 10 percent of computing resource of TI 1 GHz DSP C6415 chip while the original design with a direct method would require most of the capacity of such a DSP chip.

The R3=7/8 resample stage as the upper limit filter module can be as the virtual recursive filter 500 as shown in FIG. 5 for recursive processing in a parallel or pipelined fashion. For the time mapping, 160 audio input frames on the input 502 can be directly mapped to 147 final resampled audio out frames on the output 510. Each frame of input and output has 2048 audio samples. Another way of time mapping is that the same time mapping scheme is used at each resampling stage accordingly. The values for each stage are stored in the parameter codebook 506, which the controller (not shown) instructs the filter 504 to use for each stage. The controller can also load the parameter codebook values as appropriate for the application.

The operation of the controller is detailed in FIG. 6. In FIG. 6, the first step 600 determines the controller determining the appropriate sample ratios for the particular application. For example, in the conversion of 48 kHz to 44.1 kHz, the ratio of 44.1/48=147/160, which can be factored as 147=3*7*7, and 160=4*5*8, or as the ratios of 3/4, 7/5, and 7/8. Preferably, the values are such that the numerators or denominators are individually less than 10, even if this results in another ratio (e.g., stage of processing to occur). In other embodiments, the values can be determined by other means, and provided to the controller.

In step 602, the controller causes the ratios to be stored in the parameter codebook, so that the ratios are associated with a stage index. Thus, in the above example, the first ratio of 3/4 would be associated as the first stage index ratio, 7/5 would be stored for use as the second stage index, etc. Other parameters may also be stored in the parameter codebook for use in each stage, such as the number of frames to be sampled. Further, a variety of data structures can be used to store the information. Typically, a table format is used.

In step 604, the controller initializes the stage index to 1. In the next step 606, the initial portion of the recursive looping process is defined. Here, the controller instructs the SRC to load the parameters associated with the current stage index, which is initially set to 1. In step 608, the controller causes the input audio data stream to be presented to the input port of the SRC. In the initial loop, the data stream is the 48 kHz audio stream, which is obtained from an input port or other memory source (not shown). If this is not the initial loop or stage of processing, then the data is obtained from the buffer. The controller then instructs the SRC to process the data in step 610.

In Step 612, the output results are produced by the SRC, and in step 614 a test of whether this is the final stage occurs.

If this is not the final stage, then the stage index is incremented in step 616 and the output of the SRC is stored into the buffer in step 615. The process then loops and continues in step 606 for additional processing using the next set of parameter associated with the next stage. Thus, in this manner the output of the SRC is fed back into the SRC for recursive processing using the parameters associated with the next stage.

Once the final stage is processed in step 614, the recursive aspect is terminated and the output of the SRC in step 618 is the final audio output stream, which in this application is an audio data stream at 44.1 kHz.

Thus, in this manner, the SRC can be adapted for a particular application on a programmable basis, without requiring the hardware of multiple cascaded SRC stages.

Another application of the present invention involves audio rate transition to synchronize with another clocked signal. In the scenarios where respective audio and another time clocked signal sample rate are not locked, the proposed scheme can provide the high quality solutions. For example, assume another signal's clock is drifting away from a system reference clock. This signal frame synchronizer is used to drop a frame with certain period of time in order to provide synchronization with an external system reference. In this case, the relationship between this signal and audio samples will drift relative to one another and if left uncompensated will cause synchronization errors between audio and this signal.

There are two categories of synchronization drifting between audio and another time clocked signal: 1) the relative drifting rate is known, and 2) the drifting rate is unknown or in fact varying over time.

Assume that the data frame rate of another clocked signal is 30 frames per second. One frame drop every 30 second period could cause the audio de-synchronized with this data signal very quickly. In order to synchronize with the signal frame dropping, the audio must "drop' some audio samples in order to synchronize with the signal. However, the dropping real audio samples will cause an obvious audio glitch that is easy heard by a viewer. Thus, in order for the process to drop samples from audio stream without being noticed requires resampling the audio stream for a certain time period or number of audio segments and converting it to the new rate.

For this purpose, defining the resampling parameters depends on the signal frame dropping frequency and audio quality requirement. For example, a resample process with the following resample factor can be chosen:

$R_s$=29/30 over one second period of audio segment, or
$R_s$=59/60 over two second period of audio segment.

The "trick" part lies on selecting the length of resampling segment. The longer of resample segment, the better quality, but the resampling filter will be more complicated and demand more resources, and the 'correcting' transition will take longer period of time. From a time mapping perspective, a reasonable segment of audio frames is chosen (e.g., 25 frames) with having 1024 samples per frame, with the segment resampled down to a new segment comprising 48,000/30=1600 samples less than originally present. Here, an original 48 kHz sample frequency and the 1024 sample audio frame size is assumed. For perfect time mapping with frame size multiples, the equivalent time of video drop in terms of audio frame size multiples is 1600=25/16*1024 audio samples. In other words, 1600 samples is:

1600 sample/1024 samples/frame=1.5625 frames.

Taking 25 frames ($F_a$) of audio samples and using the following resampling system:

$$R = \left(1 - \frac{\frac{25}{16}F_A}{25F_A}\right) = \frac{15}{16}$$

This is, the audio frame-based perfect resampling and time mapping system with a segment of 25 original audio flames to compensate another signal frame drop of frame rate 30 fps with the limitation of that the signal frame drop rate cannot be more than once over a period of 25 audio frames. This results in essentially converting the audio to 25−1.5625=23.4375 frames. This ratio 23.4375/25 is the same ration as 15/16 derived above. This could be factored as 3/4*5/4 and performed in two recursive stages. For higher audio quality, the audio frame-based resampling rate can be R=31/32, over a segment period of 50 audio frames. However, 31 is a prime number, which cannot be factored, but only approximated.

In the case where the drift rate is unknown or varies over time, fixed conversion rate techniques can not be used. Traditionally, there are multiple solutions to this problem. There are two major classes of solutions: using continuous and discrete sample rate conversions. The preferred solution depends on tradeoffs between audio fidelity, system complexity, cost, maintaining lip synch with the video, and other application requirements.

In case of continuous sample rate conversion, the system is able to track the phase drift between the audio and video and adaptively apply different sampling ratios as required. This class of resampler is an asynchronous sample rate conversion (ASRC). They are implemented using a polyphase filter with adaptive parameters. These work well over a wide range of resampling ratios while producing excellent results. On the downside, these are quite complicated and expensive (almost prohibitively so) to realize.

A simple discrete sample rate conversion instead of detecting gradual phase change detects a discrete event where the video frame synchronizer must drop or repeat a frame. In this case audio samples are also dropped, repeated or blended between audio discontinuous samples at time near the video frame sync event. Although this technique is comparatively simple to implement, it only performs relatively well for situations where the drift rate is small and the frame sync event is not frequent.

The proposed multi-staging and recursive resampling system is very suitable for adaptive and wide range time drift correction. Because it is a polyphase filter with discrete adaptive parameters and adaptive stages, it can approach the ASRC performance with fewer implementation requirements, system complexity, and cost. Further, the multi-staging and recursive resampling system can track the phase drift between the audio and video and select an appropriate sample ratio as appropriate. Thus, if the audio track needs to be compressed, a sampling rate of less than 1 can be used, or vice versa.

A multi-staging resampler has fixed number of resampling stages and resampling parameters. However, a recursive resampler as defined herein can vary the resample stage number and select a set of discrete parameters from a parameter codebook with a wide range resample ratios. Further, the set of parameters can be loaded based on the particular application. Hence, it is possible to adapt the same architecture for a different applications, as opposed to implementing a fixed number of stages for each individual application, as taught by the prior art.

The quality and the length of re-sync period can be controlled using this proposed resample system according to requirements or can be defined for the application.

For instance, a resampler with the conversion ratio close to 1 can be designed using the proposed scheme. Its parameter codebook is populated with various parameter sets for different conversion ratios (larger and less than 1) and for the re-sync periods. A set of parameters including number of resample stages, length of re-sync period, and polyphase filter coefficients can be chosen based upon the detected results of current conversion rate and convergence speed at a time. Thus, the present invention allows a single structure that can be used for converting an audio track to either expand or compact an audio segment as needed. This programmable capability showcases the flexibility of this approach from the prior art.

The multi-staging and recursive audio resampling and time mapping scheme has been disclosed with two major applications, but those skilled in the art will appreciate other applications exist. The invention provides the better quality, lower computational complexity, less memory requirement and easier implementation than conventional and direct resampling system design and implementation. It makes some prohibitive applications such as ASRC feasible with dramatic system cost reduction and wide range applicability.

The invention claimed is:

1. A method for converting a first digitized audio data stream having a first rate to a second digital audio data stream having a second rate using a system comprising a sample rate converter, a buffer, a parameter codebook memory, and a controller, comprising the steps of:
   a) determining a resampling ratio of said first digitized audio data stream comprising a first number of audio frames to said second digital audio data stream comprising a second number of audio frames wherein said resampling ratio is defined by the number of first audio frames to said second number of audio frames;
   b) determining a plurality of factoring ratios wherein a product of the plurality of factoring ratios equals said resampling ratio;
   c) storing by said controller into said parameter codebook said plurality of factoring ratios, wherein said plurality of factoring ratios are respectively associated with one of a set of consecutive unique stage index numbers;
   d) receiving a first segment of said first digitized audio data stream, said first segment comprising a first fixed number of audio frames of the first digitized audio data stream at said first rate at the sample rate converter,
   e) retrieving one of the plurality of factoring ratios stored in said parameter codebook memory into said sample rate converter, wherein said one of the plurality of factoring ratios is associated with an initial stage index number;
   f) processing in said sample rate converter at the direction of said controller said first segment of said first digitized audio data stream using said one of the plurality of factoring ratios to produce an intermediate data stream comprising a second number of audio frames wherein the second number is different from said first number;
   g) storing said intermediate data stream in the buffer;
   h) determining in said controller whether all said plurality of factoring ratios in the parameter codebook memory have been used;
   i) if all of said plurality of factoring ratios have not been used, then copying said intermediate data stream from said buffer into said sample rate converter, retrieving another one of the plurality of factoring ratios from said parameter codebook memory associated with a subsequent stage index number into said sample rate converter, and processing said intermediate data stream by said intermediate data stream to produce another intermediate data stream; and
   j) if all of said plurality of factoring ratios have been used, then providing said another intermediate data stream as said second digital audio data stream.

2. The method of claim 1 wherein said resampling ratio is 147:160.

3. The method of claim 2 wherein said plurality of factoring ratios comprises the values 3/4, 7/5, and 7/8.

4. The method of claim 1 wherein said sample rate converter comprises a programmable digital signal processor.

5. The method of claim 1 comprising the step of:
   maintaining a counter wherein said counter is a value indicating a number of factoring ratios that have been processed.

6. The method of claim 1 wherein step i) is repeated once.

7. The method of claim 1 wherein the first digitized audio data stream having the first rate is at 48 kHz and the second digitized audio data stream having the second rate is at 44.1 kHz.

8. The method of claim 1 wherein the parameter codebook memory further stores a number indicative of the number of samples in the first digitized audio data stream.

9. The method of claim 1 wherein the steps a) through j) are repeated using a different set of a plurality of factoring ratios.

10. A system for converting a first digitized audio data stream having a first rate to a second digital audio data stream having a second rate using a sample rate converter, comprising:
    a sample rate converter comprising an input interface configured to receive said a digitized audio data stream at the input interface comprising a first number of audio frames, said sample rate converter having an output interface configured to output said second digital audio data stream comprising a second number of audio frames;
    a codebook parameter memory connected to said sample rate converter, said codebook parameter memory operable to store a first set of plurality of sample ratios wherein each sample ratio is associated with a processing stage index, said codebook parameter memory operable to provide each of the first set of plurality of sample ratios to the sample rate converter for an indicated processing stage index;
    a buffer comprising sufficient memory storage to receive from said output interface said second digital audio data stream and store said second digital audio data stream as contents of said buffer, said buffer configured to provide said contents to said input interface of said sample rate converter; and
    a controller operable connected to said sample rate converter and said codebook parameter memory, said controller configured to store said first set of plurality of sample ratios in said memory wherein each one of the plurality of sample ratios is associated with said respective processing stage index value, said controller configured to maintain a current stage index value of said sample rate converter, said controller configured to instruct said parameter codebook memory to provide a particular one of the plurality of sample ratios from the first set to said sample rate converter, said controller configured to instruct said sample rate converter to process the digitized audio data stream at the input interface to produce said second digital audio data stream wherein the ratio of the first number of audio frames to the second number of audio frames is equal to said particular one of the plurality of sample ratios.

11. The system of claim 10 wherein the controller is configured to recursively cause the sample rate converter to process said second digitized audio data stream from the output interface as the input digitized audio data stream at the input interface in a subsequent stage of processing by said sample rate converter.

12. The system of claim 11 where the first input audio data stream is sampled at 48 kHz and the second digital audio data stream is sampled at 44.1 kHz.

13. The system of claim 12 wherein the plurality of sample ratios stored in the sample rate converter comprises 3/4, 7/5, and 7/8.

14. The system of claim 10 wherein the sample rate converter comprises a digital signal processor.

15. The system of claim 10 wherein said parameter codebook memory stores a second set of plurality of sample ratios.

16. The system of claim 15 wherein said parameter codebook memory stores the first number of audio frames which is used to determine a size of the digitized audio data stream at the input interface to process by said sample rate converter.

17. The system of claim 10 wherein the controller is configured to compute said first set of plurality of sample ratios in said memory.

18. A method of converting a first digitized audio data stream comprising a first number of audio frames encoded at 48 kHz to a second digital audio data stream comprising a second number of audio frames at 44.1 kHz using a system comprising a sample rate converter, a buffer, a parameter codebook memory, and a controller, comprising the steps of:

loading a first sample ratio into said sample rate converter from said parameter codebook memory;

loading a first segment comprising a first number of audio frames into said sample rate converter;

converting said first segment into a second segment of audio frames by said sample rate converter using said first sample ratio, wherein said second segment comprises a second number of audio frames, wherein further said first sample ratio is equal to a ratio of said first number of audio frames to said second number of audio frames;

loading said second segment into said sample rate converter;

loading a second sample ratio into said sample rate converter from said parameter codebook memory;

converting said second segment into a third segment of audio frames by said sample rate converter using said second sample ratio, wherein said third segment comprises a third number of audio frames, wherein further said second sample ratio is equal to a ratio of said second number of audio frames to said third number of audio frames;

loading said third segment into said sample rate converter;

loading a third sample ratio into said sample rate converter from said parameter codebook memory;

converting said third segment into a fourth segment of audio frames by said sample rate converter using said third sample ratio, wherein said fourth segment comprises a fourth number of audio frames, wherein further said third sample ratio is equal to a ratio of said third number of audio frames to said fourth number of audio frames; and storing said fourth segment of audio frames into a buffer.

19. The method of claim 18 wherein the product of the first sample ratio, the second sample ratio, and the third sample ratio is 147:160.

* * * * *